(12) United States Patent
Lönnberg et al.

(10) Patent No.: US 9,735,339 B2
(45) Date of Patent: Aug. 15, 2017

(54) PIEZOELECTRIC DEVICE AND AN APPARATUS

(71) Applicant: Aito B.V., Zaandam (NL)

(72) Inventors: Jockum Lönnberg, NT Amsterdam (NL); Vesa Korhonen, Helsinki (FI); Turo Keski-Jaskari, Vantaa (FI)

(73) Assignee: AITO B.V. (NL)

( * ) Notice: Subject to any disclaimer, the term of this patent is extended or adjusted under 35 U.S.C. 154(b) by 464 days.

(21) Appl. No.: 14/399,298

(22) PCT Filed: May 8, 2013

(86) PCT No.: PCT/EP2013/059635
§ 371 (c)(1),
(2) Date: Nov. 6, 2014

(87) PCT Pub. No.: WO2013/167683
PCT Pub. Date: Nov. 14, 2013

(65) Prior Publication Data
US 2015/0091414 A1    Apr. 2, 2015

(30) Foreign Application Priority Data
May 8, 2012  (EP) ..................... 12167151

(51) Int. Cl.
*H01L 41/09* (2006.01)
*G06F 3/00* (2006.01)
(Continued)

(52) U.S. Cl.
CPC .......... *H01L 41/0973* (2013.01); *G06F 3/016* (2013.01); *G06F 3/03547* (2013.01);
(Continued)

(58) Field of Classification Search
CPC .................... H01L 41/0973; H01L 41/053
(Continued)

(56) References Cited

U.S. PATENT DOCUMENTS 6,003,390 A * 12/1999 Cousy ................ H03K 17/9643
                                                    310/338
8,400,046 B2 * 3/2013 Hayamizu ................ B62M 3/08
                                                    310/332
(Continued)

FOREIGN PATENT DOCUMENTS

WO    WO 2011158154    12/2011

OTHER PUBLICATIONS

International Preliminary Report on Patentability and Written Opinion for PCT Application PCT/EP2013/059635, WIPO, Nov. 11, 2014.

(Continued)

*Primary Examiner* — Derek Rosenau (57) ABSTRACT

A piezoelectric device comprises at least one element comprising at least one sheet of piezoelectric material. The element is mounted on a circuit board comprising at least one conductive layer having at least one opening. The element is located on the opening and supported by edges of the opening in such a manner that the opening extends laterally beyond the area of the sheet of piezoelectric material. The element is sandwiched between an overlay and the circuit board in such a manner that vibrations of the sheet of piezoelectric material are sufficient to cause vibration of the overlay.

6 Claims, 5 Drawing Sheets

(51) Int. Cl.
    *G06F 3/01*          (2006.01)
    *G06F 3/041*         (2006.01)
    *G06F 3/0488*       (2013.01)
    *G06F 3/0354*       (2013.01)
    *H01L 41/053*       (2006.01)

(52) U.S. Cl.
    CPC ........ *G06F 3/0414* (2013.01); *G06F 3/04883* (2013.01); *H01L 41/053* (2013.01); *G06F 2203/0339* (2013.01)

(58) Field of Classification Search
    USPC .................................. 310/328, 330, 331, 332
    See application file for complete search history.

(56) References Cited

U.S. PATENT DOCUMENTS 8,427,441 B2 *   4/2013   Paleczny ................. G06F 3/016
                                                                        310/328
2010/0315370 A1   12/2010   Tuovinen
2011/0050406 A1    3/2011   Hennig

OTHER PUBLICATIONS

International Search Report for PCT Application PCT/EP2013/059635, EPO, Aug. 28, 2013.
Written Opinion in PCT Application PCT/EP2013/059635, EPO, Aug. 28, 2013.

* cited by examiner

PIEZOELECTRIC DEVICE AND AN APPARATUS

FIELD OF THE INVENTION

The invention relates to piezoelectric devices.

BACKGROUND ART

A piezoelectric sensor device is known from international patent application PCT/IB2011/052501 that has been published under WO 2011/158154 A2.

OBJECTIVE OF THE INVENTION

As discussed in WO 2011/158154 A2, an element comprising a sheet of piezoelectric material can be used a sensor. Bending of the piezoelectric material generates a voltage that can be detected.

Now we are working on a new kind of piezoelectric device that shall be a multi-piezoelectric device, possibly with a number of sensors with improved properties. In the first place, our new multi-piezoelectric device is going to be used as a piezoelectric sensor device.

In order to improve the usability of the piezoelectric sensor device, we plan to design the multi-piezoelectric device in such a manner that it can give feedback to the user, the feedback most advantageously being both tactile and audible.

Based on general properties of piezoelectric materials, an element comprising a sheet of piezoelectric material can be made vibrate by applying a voltage over the sheet of piezoelectric material.

SUMMARY OF THE INVENTION

Figure 1:
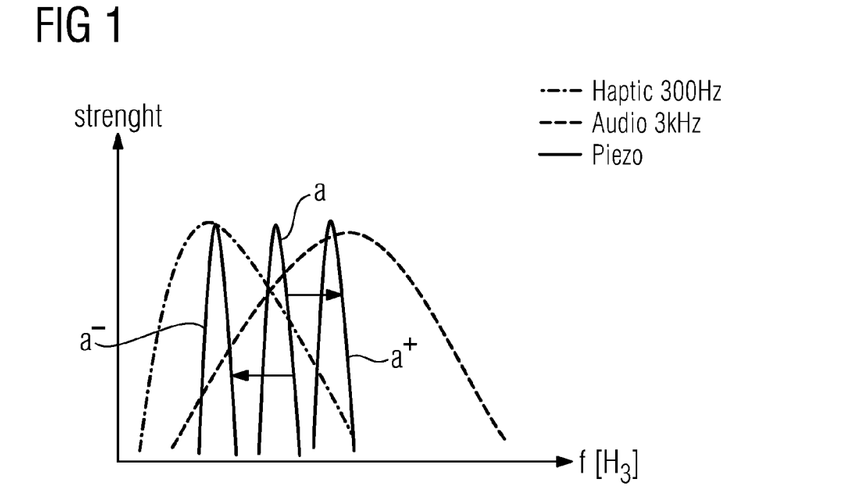
FIG. 1 illustrates the strength of resonance as a function of frequency for an element comprising a sheet of piezoelectric material, as well as typical human perception for tactile and audible signals resulting from the element.

Curve a in FIG. 1 illustrates the strength of resonance as a function of frequency for an element comprising a sheet of piezoelectric material. When the element is fixed on a printed circuit board, the peak resonance typically shifts towards a higher frequency. The shifted strength of resonance is illustrated by curve $a^+$.

For our purpose of giving tactile feedback, this frequency shifting ($a \rightarrow a^+$) is contra-productive, since tactile feedback from a sheet of piezoelectric material is at strongest perceived by humans at around 300 Hz and at higher frequencies the perception rapidly falls. For our purpose of giving audio feedback, however, we consider the frequency shifting slightly beneficial, even though audio feedback is not necessary for us. Humans tend to observe audio feedback from a sheet of piezoelectric material at strongest at around 3 kHz.

However, and more importantly, audio feedback can still be perceived at the region of the tactile feedback, so it is a first objective of our invention to improve the tactile feedback properties of a piezoelectric device. We have found out that we can achieve this by down-shifting the peak resonance frequency of a piezoelectric device.

From the viewpoint of production of piezoelectric devices in larger numbers, it is desirable to assemble them by means of pick-and-place devices by using surface mounting technology. A second objective of our invention is to make the assembling of a piezoelectric device using pick-and-place assembly easier.

The first objective of the invention can be solved with a piezoelectric device according to independent claim 1. The dependent claims 2 to 6 describe advantageous aspects of the piezoelectric device.

The second objective of the invention can be solved with a piezoelectric device according to independent claim 7. The dependent claims 8 to 15 describe advantageous aspects of the piezoelectric device.

Claim 16 describes an apparatus in which a piezoelectric device according to any one of claims 7 to 15 has been assembled.

Advantages of the Invention

A piezoelectric device according to the first aspect of the invention comprises at least one element that comprises at least one sheet of piezoelectric material defining an area. The element has been mounted or placed on a circuit board comprising at least one conductive layer with at least one opening in the conductive layer. The element is located on the opening and supported by edges of said at least one opening, in such a manner that the opening extends laterally beyond the area of the sheet of piezoelectric material.

The element is sandwiched between an overlay and the circuit board in such a manner that vibrations of the sheet of piezoelectric material are sufficient to cause tactile vibration of the overlay.

We have found out that with this configuration, the resonance frequency of the mounted element can be shifted to a lower frequency (i.e. $a \rightarrow a^-$ in FIG. 1) and so to a frequency range on which the tactile perception at humans is stronger in comparison with the situation before shifting (i.e. curce $a^+$). Particularly advantageously, the piezoelectric device may be so configured that pressure exerted on the overlay is sufficient to cause bending of the at least one sheet of piezoelectric material to generate a detectable signal, in which case the piezoelectric device is also a sensor device.

A piezoelectric device according to the second aspect of the invention comprises an element which comprises at least one sheet of piezoelectric material. The element has been mounted or placed on a printed circuit board that is a multi-layer printed circuit board
 i) which comprises at least two conductive layers with at least two associated isolating layers on both sides of the lower conductive layer,
 ii) of which layers the upper isolating layer and the upper conductive layer have been removed at a location, and
 iii) at the location, there is at least one opening also in the lower conductive layer,
in such a manner that the element is located on the opening and is being supported by edges of the opening in the lower conductive layer.

The element is sandwiched between an overlay and the printed circuit board in such a manner that vibrations of the sheet of piezoelectric material are sufficient to cause tactile vibration of the overlay. The element has been electrically connected from the sheet of piezoelectric material, from a metallic disc acting as an electrode and on which the sheet has been mounted, or from both, to the multi-layer printed circuit board, by using at least one electrical connection that is made from above to the sheet and/or metallic disc, and to the multi-layer printed circuit board and without removing insulating material from the multi-layer printed circuit board.

We have found out that with this configuration, pick-and-place machines can be used much more effectively thanks to the removal which creates a recess into which the element can be placed accurately. This solution enables a much easier and faster assembly than our former solution (cf. WO 2011/158154 A2), where the electrical connection between the conductive layer of the PCB and the sheet of piezoelectric material has required an additional electrical connection between a conductive layer that contacts the piezoelectric material, and the PCB. At times, this has been problematic because of the layer of adhesive material that is located between the PCB and the conductive layer and that must been punctured. The new solution simplifies the assembly since now the components need only to be placed on the PCB, after which the electric connection is made from above in a single process.

The at least one opening in the conductive layer advantageously comprises a circular part and at least one extension to the circular part. When the element is mounted on the circular part, the mutual alignment between the element and the printed circuit board can be neglected.

We have found out that, particularly advantageously, the extension may be a segment radially distancing from the circular part. In this manner, the easy mountability can be practically combined with the frequency downshifting.

If the opening comprises at least two extensions that are segments radially distancing from the opening and have been arranged in a symmetric manner around the opening, the frequency downshifting may be improved. Alternatively or in addition to this, the fixing of the element may be made simpler.

If the extension comprises a circular opening that is concentric to the main opening, or a segment of a circle that is concentric to the main opening, we may obtain advantageous frequency profile, in particular by better avoiding parasitic high audio frequencies.

If the opening comprises at least two extensions that have been configured to leave a tongue of the conductive layer in between them, and wherein the element has been fixed to the printed circuit board at the position of the tongue, the fixing of the element can be made simpler because the tongues offer a surface well suitable for fixing, in particular, by soldering, gluing or welding. In addition, we may better prevent tin, glue, or welding material from entering to below the element.

At the location, there is advantageously a recess that has as its depth 0.1 to 0.5 mm resulting from the removal of uppermost conductive layer and the at least one isolating layer before the next conductive layer. Since the element advantageously has as its thickness 0.1 to 0.5 mm, most preferably the depth of the recess is selected so that it will be larger or equal to the thickness of the element.

LIST OF DRAWINGS

In the following, both aspects of the present invention are described in more detail with reference to examples shown in FIGS. 2 to 10 of the attached drawings, of which.

Same reference numerals refer to same features in all FIG.

DETAILED DESCRIPTION

Figure 2:
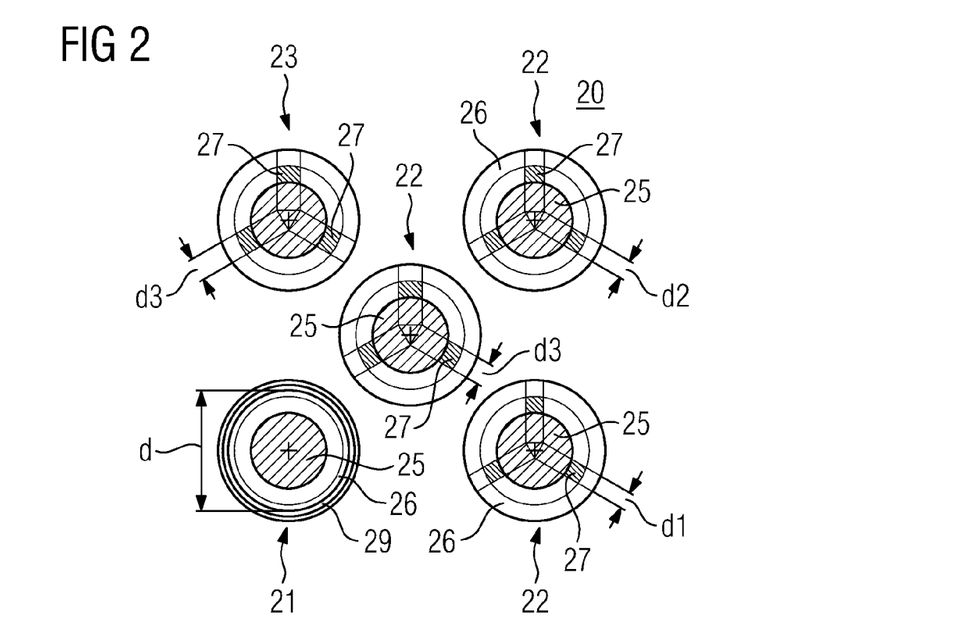
FIG. 2 illustrates details of an exposure pattern for a light-sensitive circuit board.
Figure 3:
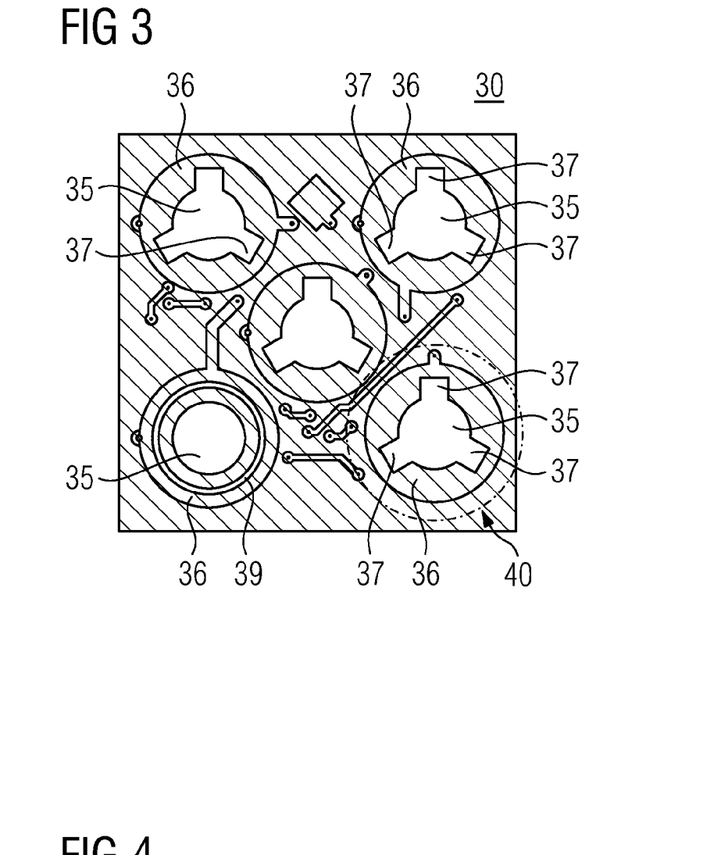
FIG. 3 illustrates a piece of a printed circuit board.

FIG. 2 illustrates details of example exposure patterns 21, 22, 23 that can be used to manufacture printed circuit board 30 shown in FIG. 3. Printed circuit board 30 may be printed by exposing a layer of photo-sensitive lacquer to light with which the uppermost conductive layer 51 of a blank is coated, while masking it with the exposure pattern, for example. After exposure, the unexposed regions of the conductive (mostly gold flash plated copper) layer 51 of the blank where the photo-sensitive lacquer did not react are removed by etching. This so when the printed circuit board 30 is made from a blank by using the photographic method.

There are several other known methods for manufacturing printed circuit boards, and in principle any of them can be used to manufacture the printed circuit board 30. Depending on the method chosen, the details of the exposure pattern may vary. For example, if the exposed regions of the conductive layer of the printed circuit board 30 will be removed, the exposure pattern is most preferably a negative of that in FIG. 2.

In our example, exposure pattern 21 contains circular area 25, ring 26 and annulus 29. Exposure patterns 22, 23 contain three arms 27. It is to be understood that the number of arms 27 in each pattern 22, 23 may vary.

In FIG. 2, the thickness of arms 27 have been denoted by d1, d2 and d3. Preferably, we use d1=3.0 mm, d2=4.0 mm and d3=5.0 mm. The diameter of the annulus 29 has been denoted by d.

Arms 27 are symmetrical extensions or extrusions in the circular area 25. We have noticed that this reduces clamping of the element 58 containing sheet 54 of piezoelectric material mounted on metallic disc 53 that acts as an electrode. The reduction of the clamping increases significantly the tactile output energy and reduces the parasitic audio output of element 58.

The reduction of clamping is probable to result from two factors. Arms 27 reduce the compressive pressure caused by the disc 53 of the element 58 as perceived by the sheet 54 of piezoelectric material. In this manner, the reduction of clamping reduces the effective stiffness of the assembled device.

Discs 53 are fixed to printed circuit board 30 with soldering, gluing or welding, for example. In addition to or instead of the fixing, element 58 may be held in place by compressive pressure due to compression between overlay 503 and circuit board 51. Openings (circular opening 35, extension arms 37, annulus 39) limit the contact area between disc 53 and printed circuit board 30.

Of the openings in the conductive layer 51 of printed circuit board 30, arms 27 extend beyond the area of the sheet 54 of piezoelectric material. If the openings comprise an annulus 39, the annulus is beyond the area of the sheet 54.

Figure 4:
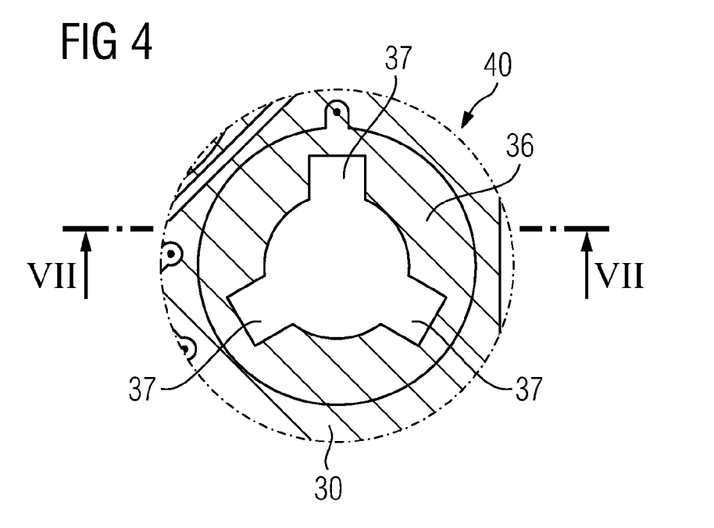
FIG. 4 is a detail of FIG. 3.

In FIG. 4 we see that disc 53 may be as large as the solid line encompassing single pattern 40 and encompassing arms 37 and conductive area 36. It follows that circular opening 35 should be smaller than diameter of disc 53 so that disc 53 will be supported by edges of circular opening 35 and that the extensions to the circular opening 35 should reach further than the area of the sheet 54 of piezoelectric material. It must be understood that the shape, number and position of the openings can be optimized accordingly to the integration properties and piezo disc properties.

Element 58 is fixed to printed circuit board by using fixing material 84 such as glue, tin, or welding material. Alternatively, or in addition to this, element 58 can be held in place due to compressive pressure between the layers above and below element 58.

Figure 5:
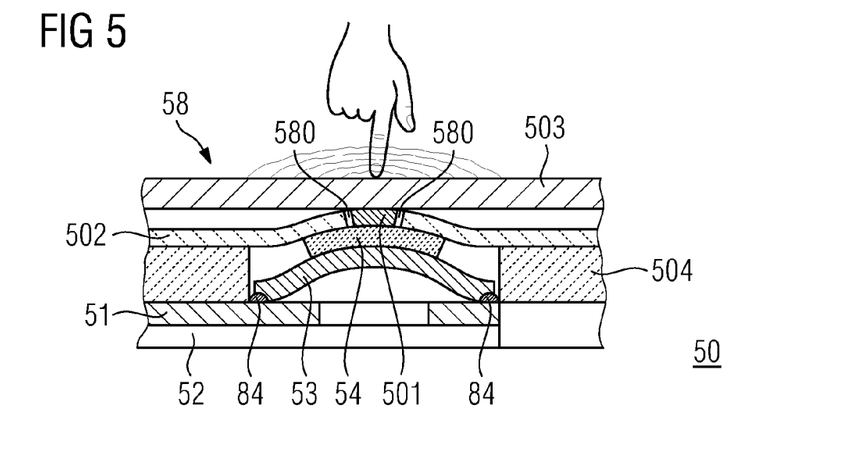
FIG. 5 illustrates a section of an element comprising a sheet of piezoelectric material that has been bent upwards.
Figure 6:
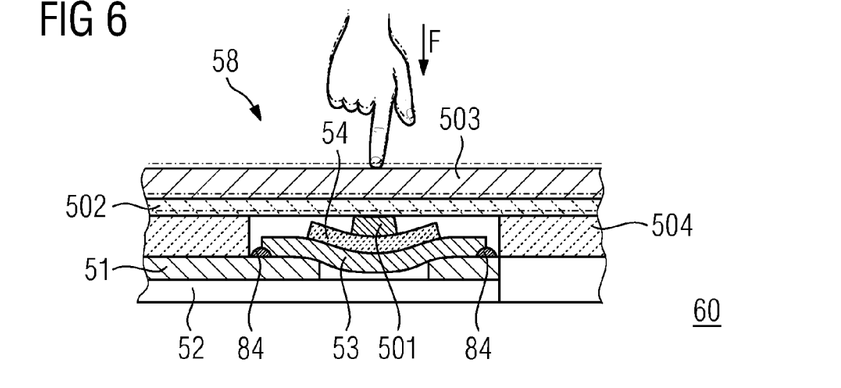
FIG. 6 illustrates a section of an element comprising a sheet of piezoelectric material that has been bent downwards.

FIGS. 5 and 6 illustrate piezoelectric device 50 comprising printed circuit board 50 and element 58. On top of element 58, more particularly on top of sheet 54 of piezoelectric material, there may be dot 501.

Figure 7:
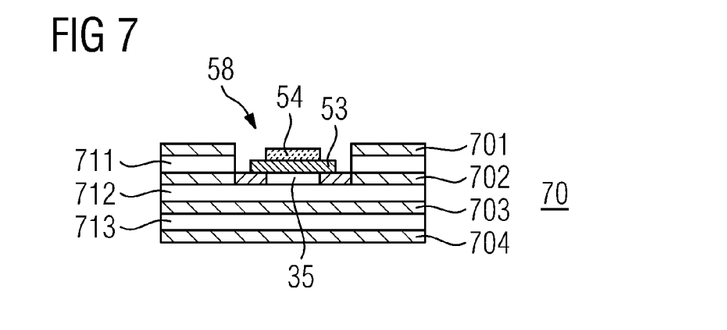
FIG. 7 a printed circuit board comprising four conductive layers with an isolating layer between each of the conductive layers.

Piezoelectric devices 50, 60, 70 in FIGS. 5, 6 and 7 may be used to implement a multi-piezoelectric device comprising a number of piezoelectric sensors (2, 3, 4, 5, 6, . . . ). Referring to the schema illustrated in FIGS. 2 and 3, the multi-piezoelectric device comprises more than one piezoelectric sensor devices sandwiched between overlay 503 and circuit board 30, 78 in such a manner that pressure (force F in FIG. 6) exerted on the overlay 503 is sufficient to cause bending of the sheet 54 of piezoelectric material. At least one of the piezoelectric sensors is a piezoelectric device 50, 60, 70 that is configured to impart vibrations of the sheet 54 of piezoelectric material to create tactile vibration in the overlay 503.

According to a further aspect of our invention, the multi-piezoelectric device may comprise a number of piezoelectric sensors (2, 3, 4, 5, 6, . . . ) sandwiched between overlay 503 and circuit board 30, 78 in such a manner that pressure (force F in FIG. 6) exerted on the overlay 503 is sufficient to cause bending of the sheet 54 of piezoelectric material. In contrast to the embodiment discussed in the preceding paragraph, it is possible to implement the at least one piezoelectric device 50, 60, 70 that is not configured to be used as a sensor in the multi-piezoelectric device to impart vibrations of the sheet 54 of piezoelectric material to create tactile vibration in the overlay 503.

A great advantage that may be obtained by using any of the multi-piezoelectric devices of the preceding two paragraphs is that the piezoelectric sensors can be used to sense the presence of a user finger to generate input. Even better, since the apparatus is a multi-piezoelectric device, if the presence of the user finger can be detected consecutively in more than one of the piezoelectric sensors (i.e. in two or three in the embodiment of FIG. 3), the multi-piezoelectric device may be configured to interpret this as a sweep of the finger. In particular, by using five piezoelectric sensors in the multi-piezoelectric device, the sweep can be detected from top to down, down to top, left to right, right to left, and diagonally in all four directions. When a sweep has been detected, the multi-piezoelectric device uses the piezoelectric device 50, 60, 70 that may but does not need to be one of the sensors to create tactile vibration in the overlay 503. Alternatively or in addition to this, the multi-piezoelectric device may be configured to generate tactile vibration after the user finger has been detected at one sensor only.

Dot 501 is preferably 20 to 50 μm thick and has a diameter of 2 to 5 mm. Dot 501 may be produced by screen printing of two layers of lacquer (at simplest, screen printed lacquer used as insulation layer in membrane packages) or four layers of silver. Dot 501 can be located as shown in FIG. 6 i.e. below upper conductive sheet 502 or on the opposite side of upper conductive foil 502 i.e. on top of it. If dot 501 is located below the upper conductive sheet 502, it must be conductive, but if dot 501 located on top of the upper conductive sheet 502, it may be non-conductive.

We have also found out that instead of a separate dot 501, a dot can be used that is formed integrally in the upper conductive sheet 502. For this implementation, we punched the upper conductive sheet 502 with a tool that made the dot appear.

The way of functioning of dot 501 is that it concentrates (or mediates) pressure exerted to overlay 503 to central part of the piezo disc 50 as shown in FIG. 6. In this case upper conductive foil 502 has an opening 580 (such as a hole) for dot 501 or dot 501 presses through upper conductive foil 502.

In actuation mode (mode in which the device is used to give tactile feedback), dot 501 mediates bending motion of sheet 54 of piezoelectric material to the overlay 503. Overlay 503 may move horizontally either up (tactile vibration as feedback as illustrated in FIG. 5) or down (sensing as illustrated in FIG. 6).

Preferably, the movement distance from the equilibrium position is equal in both directions. The movement may take place in an area larger than area of disc 53 with stiff overlay 503 which is fixed only of edges of a larger area. Alternatively, overlay 503 may be fixed by adhesive foil 504 from the majority of its surface to the printed circuit board 30, when movement is bending motion located in the area of the sheet 54 of piezoelectric material either induced by the user pressing the surface of overlay 503 or by the sheet piezo providing the feedback through overlay 503. Adhesive foil 504 may be 100 to 750 μm thick double sided pressure adhesive. Upper conductive foil 502 may be silver screen printed to a polyester foil having thickness of 100 to 500 μm.

Overall clamping is determined not only by fixing of disc 53 to printed circuit board 30, but the compressive pressure subjective to disc 53 resulting from the fixing of large area overlay 503 in FIG. 5 mediated by dot 501. Dot 501 may be attached to overlay 503 or it may be an integral part of overlay 503. Alternatively, dot 501 may be attached to between upper conductive foil 502 and piezo disc 50 as illustrated in FIG. 6.

Overlay 503 can be a large area and may preferably have as its thickness 0.1 to 2 mm. Overlay 503 is preferably made of plastic, aluminum or stainless steel. Overlay 503 and upper conductive foil 502 may be held in place by compressive force between overlay 503 and circuit board, especially if the overlay 503 is clamped to device 50, 60, 70. Alternatively or in addition to this, there may be an additional adhesive layer between the overlay 503 and upper conductive foil.

It is a significant improvement if the openings (circular opening 35, extension arms 37, annulus 39) are manufactured in the same manufacturing step as the printed circuit board 30 is printed. By doing so, we can avoid all additional process steps.

Piezo electric components such as elements 58 are currently very cheap and available in high volumes. In addition, they are robust and most of the available components have been optimized for use in audio buzzers. As a result from the optimization work, their best operating performance (largest output signal for a given input signal) is within range of 1 to 10 kHz.

The mounting to the elements 58 clamps the disc 53 has a significant effect to both available maximum vibration energy, but it also increases the frequency band of for such maximum output energy, referred as resonant frequency.

Elements 58 can be used for both touch sensors and tactile feedback element closely associated the touch interaction for confirming the user action by tactile cue. This can be achieved by applying high voltage (most preferably between 20 and 250 Volt) alternating drive signal to such element 58. The performance of the available tactile vibration is limited resulting in either or both too week haptic sensation or too loud audio feedback. When such the element 58 is used in a device, the challenges are even more pronounced due to aforementioned reasons.

It is especially beneficial to mount element 58 to implement touch user interfaces to a printed circuit board 30 onto which all the necessary electronics can be mounted to make a complete functional device.

The bending motion of the element 58 in sensing the touch pressure exerted by the user touching or pressing the overlay 503 is in the range of few μm and also tactile feedback of such disc is limited by the maximum amplitude that is in the range of 3 to 25 μm.

To ensure the functionality for both sensing and tactile feedback, in all embodiments of the device 50, the element 58 must be firmly fixed between the user interface overlay 503 and printed circuit board 30. The fixing causes the clamping of the element 58 reduces the wanted functionality of haptic feedback and even more importantly all the tolerance variations of the fixing result in significant variations of the haptic output performance of mounted piezo disc.

FIG. 7 illustrates another embodiment of piezoelectric device that is or comprises a multilayer printed circuit board 70. Dot 501, upper conductive foil 502, overlay 503 and adhesive 504 have been omitted in FIG. 7 for clarity but it is to be understood that multilayer printed circuit board 70 is configured in this respect similarly to devices 50 shown in FIGS. 5 and 6.

An improvement in multilayer printed circuit board 70 is that now element 58 has been mounted in a recess made into the circuit board 70 comprising several conductive layers 701, 702, 703, 704 between which there is at least one insulating layer 711, 712, 713.

The recess can be made in a multi-layer circuit board by embossing or drilling a hole to insulating layer 711 which may be an isolating (epoxy) sheet, before gluing the conductive layer 702 to insulating layer 712 which is in glued to conductive layer 703 which is part of a two-conductive-layer PCB board.

As the recess defines the positioning, surface mounting technology (SMT) or in principle any suitable pick-and-place method can be used for assembly of element 58 more efficiently with a positioning process that does not need to be very accurate.

It must be understood that as the printed circuit board 70 a circuit board having at least two conductive layers and at least two associated insulating layers can be used. Then it suffices to remove the uppermost conducting layer and the underlying insulating layer at a location and to prepare the opening (cf. FIGS. 2 and 3 and the text above) at the location for placing of the element 58.

Figure 10:
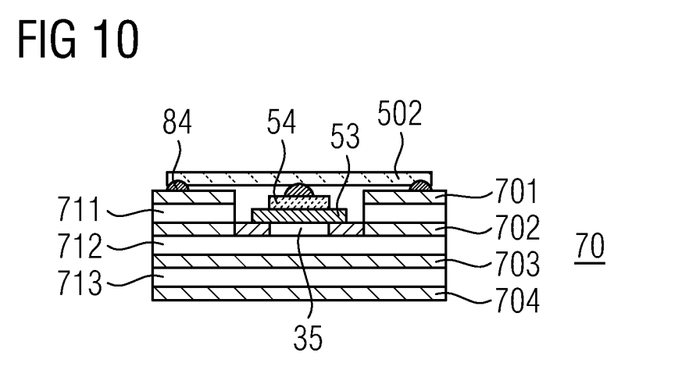
FIG. 10 illustrates the piezoelectric device of FIG. 7 with an electrical connection of the piezoelectric element to the multilayer printed circuit board.

FIG. 10 illustrates multilayer printed circuit board 70 of FIG. 7 with electrical connection between the piezoelectric element 58 and the multilayer printed circuit board 70. The electrical connection has been implemented by means of electrically conductive foil 502 that advantageously consists of or comprises individual circular thin metal foils with diameter larger than disc 53. In addition, there may be at least one arm or tongue protruding radially from the conductive foil 502 to help alignation. Most preferably, the conductive foil 502 has the shape of the area from which isolating layer has been removed from the PCB, i.e. in addition to the circular part also shows at least one extension arm 72, but is larger.

Electrically conductive foil 502 is most advantageously assembled in the same pick-and-place process (or SMT process) with the disc 53 or discs 53.

Electrically conductive foil 502 is electrically connected to sheet 54 of piezoelectric material by soldering paste 84 (standard soldering paste may be used) at the center of the sheet 54, and to the printed circuit board 70 by using soldering paste 84. The soldering may be carried out at two or three locations with larger radial distance (most beneficially 1 to 10 mm larger) from the center of the disc 53 than the radius of the disc 53 is. Such a distance is required to ensure a minimal damping of vibration of disc 53 for efficient haptic feedback.

Metallic foils used for or in the electrically conductive foil 502 may be or comprise 0.05 to 0.1 mm thick aluminum, copper or any metal feasible to be used in pick and place assembly and soldering process in Surface Mounting Technology assembly of components to multilayer printed circuit board.

The multilayer printed circuit board 70 with electrical connection between the piezoelectric element 58 and the multilayer printed circuit board 70 is used most preferably as follows:

on top of the multilayer printed circuit board 70, an adhesive layer is attached.

on top of the adhesive layer, an overlay 503 is attached.

If necessary, the overlay may comprise a dot on its below side for pre-tensioning the piezoelectric element 58.

The multilayer printed circuit board 70 can be assembled in an apparatus in such a manner that the piezoelectric device in the multilayer printed circuit board 70 causes vibration of the overlay for haptic/tactile feedback and also audible sound when energized. The multilayer printed circuit board 70 thus can be used for haptic/tactile plus audible signaling, which is especially useful such as when the multilayer printed circuit board 70 is used as an input device in the apparatus.

Figure 8:
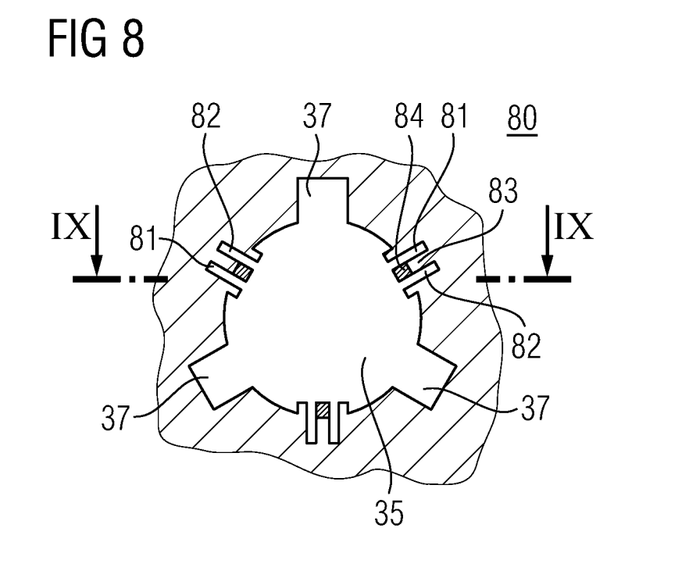
FIG. 8 illustrates a piece of a printed circuit board.

FIG. 8 illustrates a further embodiment of single pattern 80 that can be used instead or in addition to the openings (circular opening 35, extension arm, annulus 39). Now, neighbouring extensions to the opening (arms 81, 82) protrude a distance into conductive area 36 in such a manner that tongue 83 is left between them. In the example of FIG. 8, there are three such tongues 83 present but it is clear that their number may vary from one to many.

Figure 9:
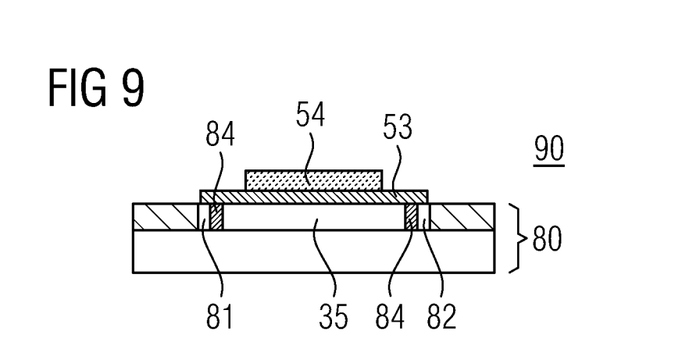
FIG. 9 is the section IX-IX of the printed circuit board of FIG. 8 with an element comprising a sheet of piezoelectric material mounted thereto.

The idea which can also be seen in section IX-IX in FIG. 9 is that tongue or tongues 83 are used to attach element 58 to pattern 80 and so to printed circuit board 30 (or to a multi-layer printed circuit board, especially to such as illustrated in FIG. 7).

Tongue or tongues 83 provide a practical fixing point. Fixing material 84 is stopped before it gets underneath the disc 53 to such a position that would overlap with sheet 54 of piezoelectric material. For example, if the fixing is performed at a single point at three tongues 83, the use of the tongues 83 may reduce the clamping effect as described above significantly. The tongues are most preferably 2 mm wide and 3 mm long.

The invention is not to be understood to be limited in the attached patent claims but must be understood to encompass all their legal equivalents.

In particular, element 58 has in the examples above been disclosed comprising a sheet 54 of piezoelectric material. It is nevertheless possible to implement element 58 with more than one sheet of piezoelectric material. In particular, it can be implemented as a multilayer piezo element with alternating layers of piezoelectric material and conductive material serving as electrode.

In the examples above, the circuit board onto which element 58 is assembled or mounted or where it is held in place has been disclosed as a printed circuit board. Instead of the printed circuit board, the element 58 can be assembled on a conductive foil (corresponding to conductive layer 51) and then assembled on a board that most advantageously is rigid. Then the upper conductive layer 502 and overlay 503 (with the optional layer of adhesive between the conductive layer 502 and overlay 503) are assembled.

LIST OF REFERENCE NUMERALS

21, 22, 23 exposure patterns
25 circular area
26 ring
27 arm
29 annulus
30 printed circuit board
35 circular opening
36 conductive area
37 extension arm
39 annulus
40 single pattern
50 piezoelectric device
51 conductive layer of printed circuit board
52 isolating layer of printed circuit board
53 disc
54 sheet of piezoelectric material
58 element
60 piezoelectric device
70 piezoelectric device
78 printed circuit board
80 single pattern
81 arm
82 arm
83 tongue
84 fixing material
501 dot
502 upper conductive foil
503 overlay
504 adhesive
580 hole

701, 702, 703, 704 conductive layer of printed circuit board
711, 712, 713 isolating layer of printed circuit board

The invention claimed is:

1. A piezoelectric device (50, 60, 70) that comprises at least one element (58) that comprises at least one sheet (54) of piezoelectric material defining an area, characterized in that:

the element (58) has been mounted or placed on a circuit board (30, 78) comprising at least one conductive layer (51; 701, 702, 703, 704) with at least one opening (35, 37; 81, 82) in the conductive layer (51; 701, 702, 703, 704);

the element (58) being located on the opening (35, 37; 81, 82) and supported by edges of said at least one opening (35, 37; 81, 82), in such a manner that the opening (35, 37; 81, 82) extends laterally beyond the area of the sheet (54) of piezoelectric material; and the element (58) is sandwiched between an overlay (503) and the circuit board (30, 78) in such a manner that vibrations of the sheet (54) of piezoelectric material are sufficient to cause tactile vibration of the overlay (503).

2. The piezoelectric device (50, 60, 70, 90) according to claim 1, wherein: said at least one opening (35, 37; 81, 82) in the conductive layer (51; 702) comprises a circular part (35) and at least one extension (37; 81, 82) to the circular part (35); and wherein the element (58) has been mounted on the circular part (35).

3. The piezoelectric device (50, 60, 70, 90) of claim 2, wherein: said extension (37) is a segment radially distancing from the circular part (35).

4. The piezoelectric device (50, 60, 70, 90) of claim 2, wherein: the opening (35, 37; 81, 82) comprises at least two extensions (37; 81, 82) that are segments radially distancing from the opening (35, 37; 81, 82) and have been arranged in a symmetric manner around the opening (35, 37; 81, 82).

5. The piezoelectric device (50, 60, 70, 90) of claim 2, wherein: said extension (37; 81, 82) comprises a circular opening that is concentric to the main opening, or a segment of a circle that is concentric to the main opening.

6. The piezoelectric device (50, 60, 70, 90) of claim 1 claims, wherein: the at least one opening (81, 82) comprises at least two extensions that have been configured to leave a tongue (83) of the conductive layer (51; 702) in between them, and wherein the element (58) has been fixed to the circuit board (30, 78) at the position of the tongue (83).

* * * * *